United States Patent [19]

Sivan

[11] Patent Number: 5,244,824
[45] Date of Patent: Sep. 14, 1993

[54] TRENCH CAPACITOR AND TRANSISTOR STRUCTURE AND METHOD FOR MAKING THE SAME

[75] Inventor: Richard D. Sivan, Austin, Tex.

[73] Assignee: Motorola, Inc., Schaumburg, Ill.

[21] Appl. No.: 577,727

[22] Filed: Sep. 5, 1990

[51] Int. Cl.[5] .......................................... H01L 21/74
[52] U.S. Cl. ......................................... 437/52; 437/47; 437/90; 257/302
[58] Field of Search ............................. 437/52, 47, 90; 148/109; 357/23.6; 257/302

[56] References Cited

U.S. PATENT DOCUMENTS

| | | | |
|---|---|---|---|
| 4,651,184 | 3/1987 | Malhi | 257/302 |
| 4,686,552 | 8/1987 | Teng et al. | 357/23.6 |
| 4,843,025 | 6/1989 | Morita | 437/47 |
| 4,845,539 | 7/1989 | Inoue | 357/23.6 |
| 5,032,882 | 7/1991 | Okamura et al. | 357/23.6 |
| 5,122,848 | 6/1992 | Lee et al. | 357/23.6 |

FOREIGN PATENT DOCUMENTS

| | | | |
|---|---|---|---|
| 61-22665 | 1/1986 | Japan . | |
| 62-54955 | 3/1987 | Japan . | |
| 63-40362 | 2/1988 | Japan | 357/23.6 |
| 63-50056 | 3/1988 | Japan | 357/23.6 |
| 63-72150 | 4/1988 | Japan | 357/23.6 |
| 2-135777 | 5/1990 | Japan . | |

OTHER PUBLICATIONS

IBM Technical Disclosure Bulletin vol. 30, No. 8, Jan. 1988, "Process to Make . . . Memory Cells".
High Performance CMOS Surrounding Gate Transistor (SGT) for Ultra High Density ISIs, by H. Takato, et al, International Electron Devices Meeting, 1988, pp. 22–25.
A Surrounding Gate Transistor (SGT) Cell for 64/266Mbit DRAMs; by K. Sunouchi et al International Electron Devices Meeting, 1989, pp. 22–26.
Selective Epitaxial Trench (SET), by V. J. Silvestri, Journal of Electrochemical Society, Solid State Science and Technology, Jul. 1988, vol. 135, No. 7, pp. 1808–1812.

Primary Examiner—George Fourson
Attorney, Agent, or Firm—Patricia S. Goddard

[57] ABSTRACT

A trench capacitor and transistor structure is formed in a semiconductor device. In one form, a transistor is fabricated within a cylindrical trench capacitor. The capacitor is formed within two displaced parallel planes in a substrate material, and has two electrodes which are separated by a dielectric material. The electrodes and dielectric are formed on a wall and a floor of the cylindrical trench. A column of epitaxial material is grown from the floor of the trench. A source region is formed by doping the top portion of the epitaxial column, and a drain region is formed by doping the floor of the trench. A gate electrode is deposited into the trench, creating a channel region along the sides of the epitaxial column. Thus, a transistor is also formed within the two displaced parallel planes in the substrate material.

13 Claims, 8 Drawing Sheets

TRENCH CAPACITOR AND TRANSISTOR STRUCTURE AND METHOD FOR MAKING THE SAME

TECHNICAL FIELD OF THE INVENTION

This invention relates to semiconductor fabrication in general, and more specifically to capacitor and transistor structures of semiconductor devices.

BACKGROUND OF THE INVENTION

Semiconductor manufacturers continue to reduce the size of semiconductor devices while increasing the performance and capabilities of the devices. Size reduction is typically achieved by reducing the dimensions of structures within the device and densifying the circuitry of the device. Manufacturers of memory devices are known to drive fabrication technology due to the fact that the circuitry of memory devices is inherently quite dense and repetitive. Therefore, to reduce the size of a memory device, one must rely on reducing the dimensions of structures within the device, such as transistors and capacitors. The smaller the structural dimensions, the more difficult the device is to manufacture. Thus, memory device manufacturers must overcome the fabrication difficulties, often before manufacturers of other devices.

Reducing the dimensions of memory structures, or memory cells which are comprised of a number of structures, may be accomplished in a few ways. One way is to shrink the elements of an existing structure, for example, using a 0.5 $\mu$m gate width rather than a gate width of 0.8 $\mu$m in a transistor. Another way of reducing the size of a memory structure is to "redesign" the structure such that it occupies less space in the semiconductor. An example of a "redesigned" structure is the SGT (surrounding gate transistor). An SGT is essentially a transistor which is built in the vertical direction as compared to transistors which have historically been planar, or built in the horizontal direction. A more detailed description of SGTs can be found in an article entitled "High Performance CMOS Surrounding Gate Transistor (SGT) for Ultra High Density LSIs," by H. Takato et al., *International Electron Devices Meeting (IEDM)*, 1988, pp. 222-225. Another example is a trench capacitor. As with an SGT, trench capacitors take advantage of the vertical space available in a semiconductor substrate material, thus reducing the overall layout size of a semiconductor device on the substrate surface. A trench capacitor used in DRAM (dynamic random access memory) applications is discussed further in U.S. Pat. No. 4,843,025 by Morita entitled, "Method of Fabricating Trench Cell Capacitors on a Semiconductor Substrate."

Incorporating and combining the vertical structures mentioned above into a DRAM cell will significantly reduce the area of a cell to under 2 $\mu$m$^2$. Such a combination (of an SGT and a trench capacitor) has been proposed for use in 64 Mbit and 256Mbit DRAMs. An example of using an SGT combined with a trench capacitor is discussed in an article published in the proceedings of the 1989 IEDM, pp. 22-26, entitled, "A Surrounding Gate Transistor (SGT) Cell for 64/256Mbit DRAMs," by K. Sunouchi et al. This article describes a DRAM cell having an SGT and a trench capacitor which are vertically aligned along the sidewalls of one trench (the SGT being above the capacitor). By combining the transistor and capacitor into one trench, a cell size on the order of 1.2 $\mu$m$^2$ has been reported, which is considerably smaller than other cell designs which have been proposed.

Disadvantages often associated with such structures are the complexity and number of the process steps required in fabrication. For example, in order to utilize vertical space, trenches to form capacitors may be made deeper. To form deep trenches, more than one trenching step may be required. Furthermore, as the trench is formed deeper the trench also becomes narrower, resulting in manufacturing difficulties during subsequent processing. Another disadvantage with a deep, narrow trench is that the effective capacitance of the cell is reduced to below a desirable amount.

BRIEF SUMMARY OF THE INVENTION

The disadvantages mentioned previously are overcome by the present invention. There is provided in accordance with this invention a structure for use in a semiconductor device, such as a memory, and a method for fabricating the structure. In one form, a transistor and capacitor are formed within a single trench in a substrate material. A capacitor is formed between first and second displaced parallel planes within the substrate material. The capacitor forms a cylinder and has first and second electrodes which are separated by a dielectric. A transistor is formed within the substrate material and contained within the cylinder formed by the capacitor and within the first and second displaced parallel planes.

DETAILED DESCRIPTION OF THE INVENTION

Figure 1A:
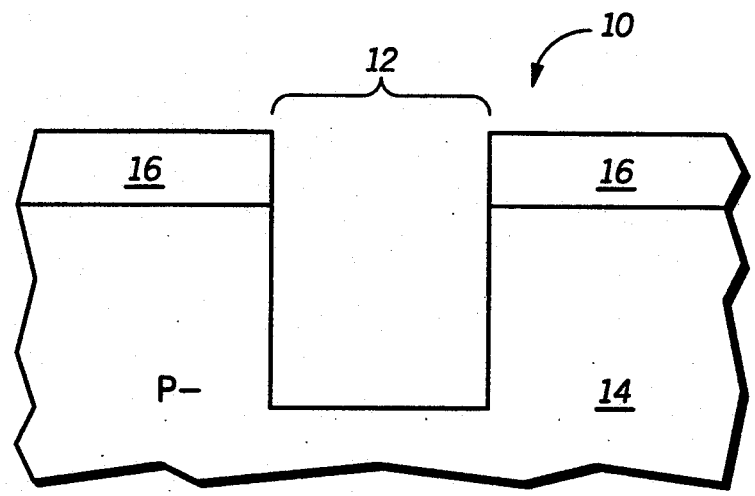
FIGS. 1(A-I) are cross-sectional views of a memory cell which illustrate a method for forming a transistor within a capacitor in accordance with the present invention.
FIG. 1J is a topographical illustration of two memory cells formed by the method depicted in FIGS. 1(A-I).

The present invention enables the area of electronic circuits, such as a memory cell, to be significantly reduced. As compared to similarly sized cells, the present invention is easier to fabricate due to the formation of a shallow trench. The advantage of easier fabrication is a result of forming a transistor within a capacitor (or capacitor within a transistor), rather than forming one above or beside the other. A method for forming this structure in accordance with the present invention is illustrated in FIGS. 1(A-I). FIG. 1A illustrates a memory cell 10 in which a cylindrical trench 12 is formed in a substrate material 14 and a field oxide layer 16. Substrate material 14 is typically silicon, but may be any semiconductor material, such as one of the III-V or II-VI compounds used by semiconductor device manufacturers. The substrate material 14 in FIGS. 1(A-I) is illustrated as being (p) type, although a material with (n) type conductivity is also an acceptable substrate material. A field oxide layer 16 is formed on substrate material 14, typically before forming trench 12. Field oxide layer 16 need not be an oxide, but may be of another surface passivating and insulating material such as silicon nitride ($Si_3N_4$). Trench 12 is formed by patterning memory cell 10 using conventional lithography and etching the cell to remove the field oxide layer and substrate material from the region where the trench is to be formed. Dimensions of the trench may be in the range of 0.5-2.0 μm in depth and approximately 0.4-2.0 μm in width, although dimensions outside of these ranges can also suitable in the present invention.

Figure 1B:
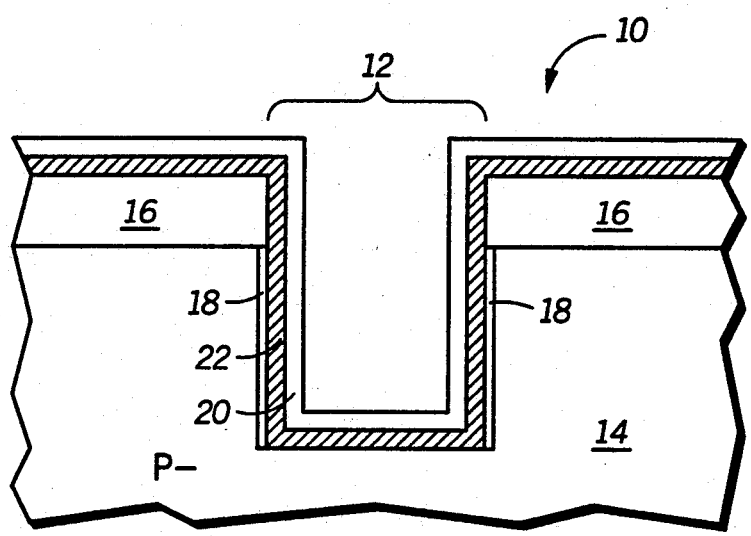

Upon forming the trench, a capacitor dielectric 18 is initially formed within substrate material 14 along the wall and floor of the trench. The cell is subjected to an anisotropic etch to remove the capacitor dielectric material from the floor of trench 12 while keeping the dielectric on the wall of the trench 12, as illustrated in FIG. 1B. The capacitor dielectric may be grown below the exposed surfaces of the underlying substrate material, or may be deposited over the entire cell. If grown, the capacitor dielectric 18 will typically be an oxide or nitride of the underlying substrate material. If deposited, the capacitor dielectric 18 may be of $SiO_2$, $Si_3N_4$, or another dielectric material. A capacitor electrode 22 is deposited on memory cell 10. The capacitor electrode is made of a conductive material, such as polysilicon or a refractory metal. Capacitor electrode 22 may or may not be doped, according to the performance requirements of the memory cell. An intermediate dielectric 20 is formed on capacitor electrode 22. Intermediate dielectric 20 may also be grown or deposited, and similar materials may be used for the intermediate dielectric as for the capacitor dielectric.

Figure 1C:
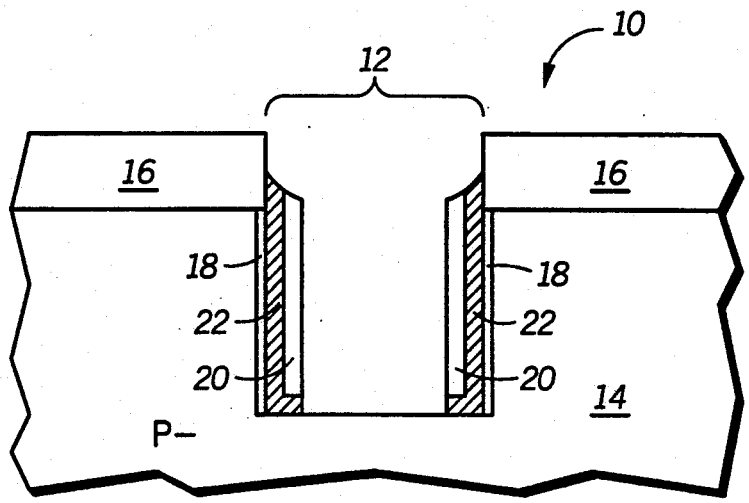

As illustrated in FIG. 1C, the memory cell 10 is exposed to an anisotropic etch which will remove the capacitor electrode 22 and intermediate dielectric 20 materials from the width of the floor of trench 12 defined by intermediate dielectric 20 and from portions of the cell overlying field oxide layer 16. The capacitor electrode 22 and intermediate dielectric 20 remain along the walls of trench 12 following the anisotropic etch. The chemistry of the etch may have the ability to etch both materials, or may be changed such that one material is removed at a time. Suitable chemistries for performing such etches are well known in the art. Depending on the materials chosen for the capacitor electrode 22 and substrate material 14, slight additional trenching of the exposed trench floor may occur during the anisotropic etch.

Figure 1D:
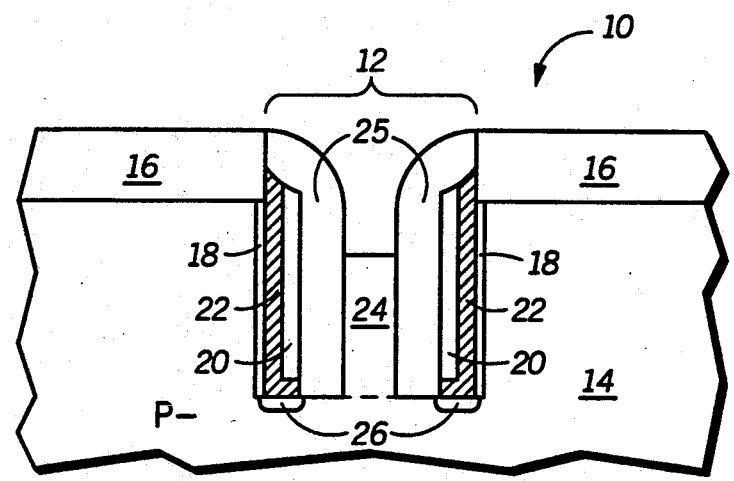

An epitaxial column (described within) is formed in the trench using the substrate material as a seed. Growth of epitaxial columns in trenches is known in the industry, as evident in the paper entitled, "Selective Epitaxial Trench (SET)," by V. J. Silvestri which appeared in the *Journal of the Electrochemical Society: Solid-State Science and Technology*, published in July, 1988, Vol. 135, No. 7, pp. 1808-12. In order to define the region in which an epitaxial column is grown, a spacer is formed in the trench. As illustrated in FIG. 1D, a first spacer material (not entirely illustrated) is deposited onto cell 10 and anisotropically etched to form a first spacer 25 in trench 12. The first spacer 25 is sacrificial, and will be removed at a later point. Therefore, a requirement in choosing a first spacer material is that it can be selectively etched to each of the underlying field oxide layer 16, intermediate dielectric 20, capacitor electrode 22, substrate material 14, and adjacent epitaxial column 24. A suitable material for first spacer 25 is $Si_3N_4$ if the intermediate dielectric 20 happens to be $SiO_2$. The first spacer material may be either a conductive material or a dielectric, provided the aforementioned requirement is fulfilled.

In forming first spacer 25, a portion of the underlying substrate is exposed in trench 12. It is this exposed portion of substrate material 14 which acts as a seed for growing an epitaxial column 24 within first spacer 25, as illustrated in FIG. 1D. Growth of epitaxial column 24 is typically accomplished by introducing the cell into a suitable environment of gases at an elevated temperature (appropriate conditions are known in the art). Because the cell is exposed to elevated temperatures over an extended period of time during the epitaxial growth, a buried contact 26 may form as a result of any dopants which might be in capacitor electrode 22 diffusing into substrate material 14. For the present discussion, it is assumed that capacitor electrode 22 is (n) type polysilicon, in which case buried contact 26 would be (n) type as well. Although it appears in FIG. 1D that two buried contacts are present, in actuality only one buried contact is formed in the shape of a ring which encircles epitaxial column 24. The reason for the appearance of two buried contacts is that this illustration is a cross-sectional view of a cylindrical trench, rather than a three-dimensional perspective. Likewise, first spacer 25 is one continuous material around epitaxial column 24 and not two spacers.

Figure 1E:
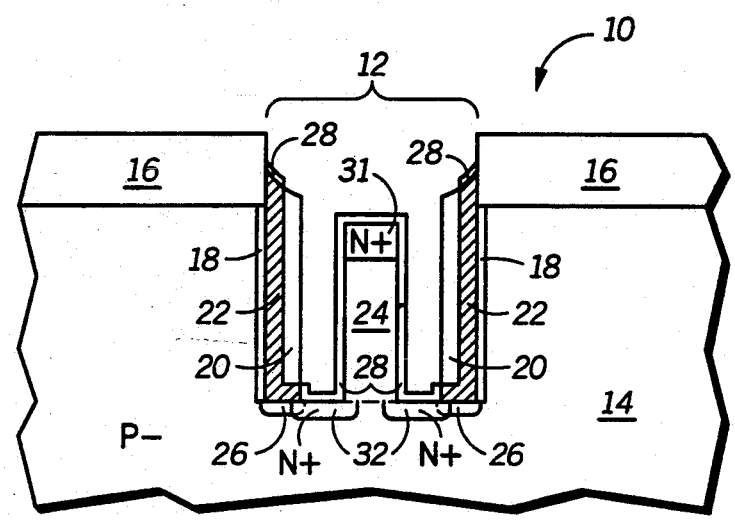

Upon forming the epitaxial column 24, the first spacer 25 is removed from the trench, typically by selective etching, while other elements within the trench of the memory cell 10 are left substantially unaltered. A gate dielectric 28 is formed on all sides of epitaxial column 24, as well as on other exposed conductive regions such as top surfaces of capacitor electrode 22 and substrate material 14, as illustrated in FIG. 1E. The gate dielectric may be grown or deposited to a thickness in the range of 5-10 nm. A blanket deposition of the dielectric material will result in a gate dielectric which extends over the entire surface of the device, and may require patterning. Growing the gate dielectric will result in a dielectric material being formed only on exposed portions of conductive elements, such as the capacitor electrode and substrate material. Memory cell 10 is then doped to form source and drain regions, 31 and 32 respectively. Doping may be accomplished by conventional processes such as ion implantation or diffusion. Choosing the dopant species used to form the source and drain regions will typically depend on the conductivity of the substrate material. In FIG. 1E, substrate material 14 is (p) type and source region 31 and drain region 32 are doped as (n) type. Although gate dielectric 28 is primarily used to electrically isolate epitaxial column 24 and capacitor electrode 22 from subsequent conducting layers, it also prevents contamination of and damage to the memory cell during the doping procedure. It should be noted that there is an overlap between (n) type drain region 32 and (n) type buried contact 26. Such an overlap is necessary in order for current to flow from the drain region 32, through the buried contact 26, to the capacitor electrode 22 which acts as the storage electrode of the capacitor.

Figure 1F:
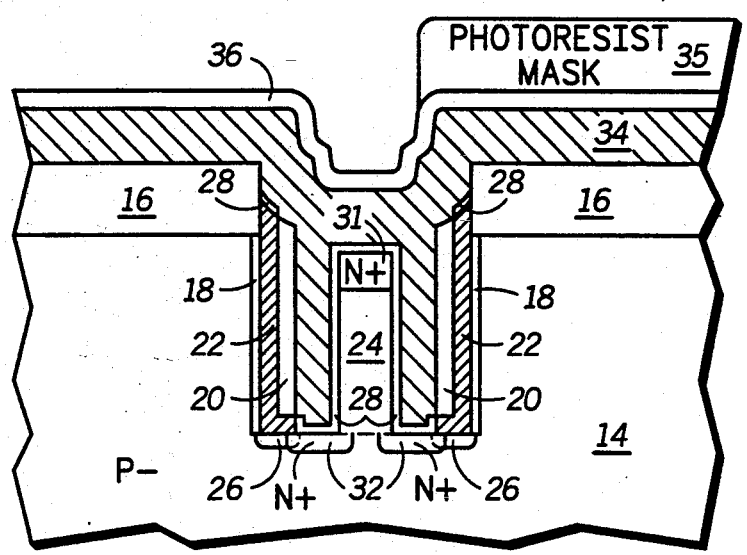

As illustrated in FIG. 1F, a conductive layer is deposited onto member cell 10, thereby forming a gate electrode 34. Materials which may be used for gate electrode 34 include polysilicon, refractory metals, or other conductive materials which are used in the fabrication of semiconductor devices. In depositing the gate electrode, it is important that the material chosen fills the region between epitaxial column 24 (which is enclosed by gate dielectric 28) and intermediate dielectric 20. Depositing a conformal conductive layer will help meet this requirement. For example, if gate electrode 34 is made of polysilicon, a conventional LPCVD (low pressure chemical vapor deposition) will enable the polysilicon to grow from the intermediate dielectric 20 toward the gate dielectric 28 on the epitaxial column, and vice-versa. Filling the region between the epitaxial column 24 and the intermediate dielectric 20 with polysilicon will create an interface which is not illustrated in FIG. 1F. Growth of a polysilicon layer on other portions of the cell may continue to the desired thickness even after the region in the trench is filled. On gate electrode 34, a protective dielectric 36 is grown or deposited. The purpose of protective dielectric 36 will be addressed at a later point. Suitable materials for use as a protective dielectric, and other dielectrics which are used in this invention, include $SiO_2$, $Si_3N_4$, or a combination of these materials. A suitable thickness for protective dielectric 36 may be on the order of 10-20 nm.

Figure 1G:
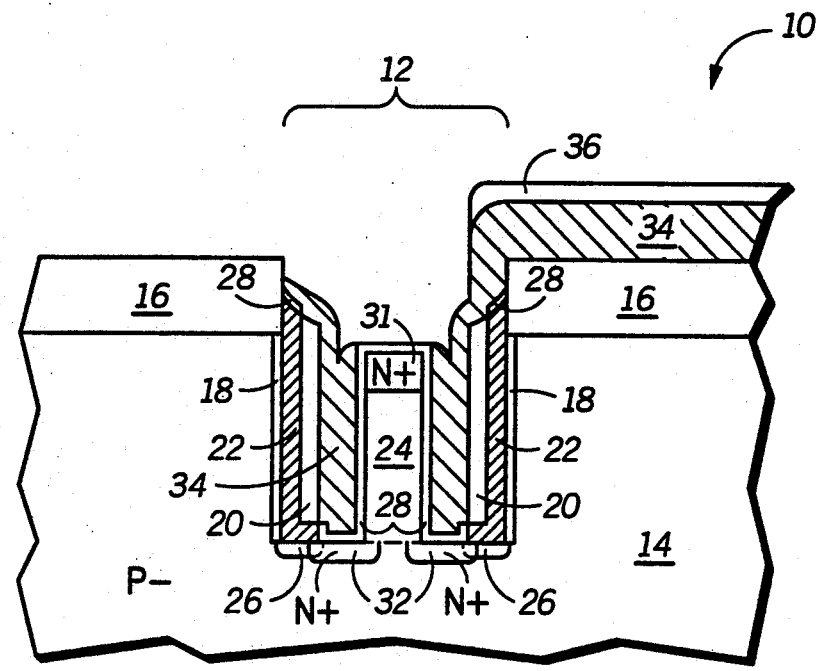

To complete the formation of gate electrode 34, memory cell 10 is patterned and etched. A photoresist mask 35 is formed on a portion of the gate electrode, as illustrated in FIG. 1F. Although depicted as a photoresist mask, any mask used in conventional lithography may be used. The photoresist mask 35 is used to define areas of the gate electrode and the protective dielectric which will be protected from subsequent etching. As illustrated in FIG. 1G, gate electrode 34 and protective dielectric 36 are anisotropically etched such that the gate electrode material is removed from the top of epitaxial column 24. It should be noted that the gate electrode 34 and protective dielectric 36 are also removed from areas of cell 10 not protected by the photoresist; however, it is necessary to have electrical continuity from the trench to circuitry elsewhere in the semiconductor device. As illustrated in FIG. 1G, this is achieved with the gate electrode material extending out of and to the right of trench 12. Although it appears that gate electrode is comprised of two individual segments in this figure, keep in mind that the figure is a cross-sectional view of a cylinder. Therefore, in a three-dimensional image, gate electrode 34 will encircle epitaxial column 24 and will be continuous. This is also true for the other elements within the cylindrical trench, such as capacitor dielectric 18, capacitor electrode 22, intermediate dielectric 20, gate dielectric 28, buried contact 26, and drain region 32.

Figure 1H:
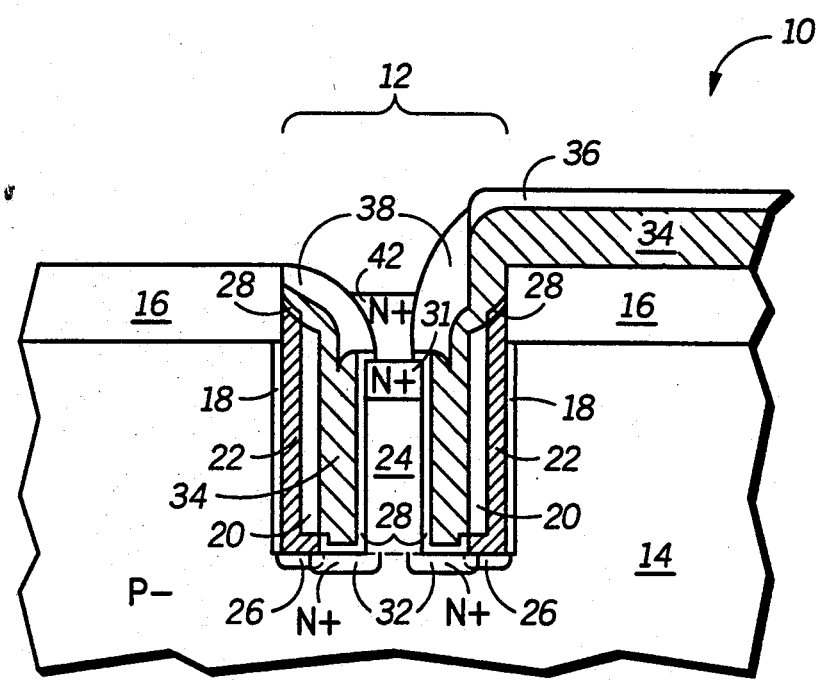

Upon forming the protective dielectric, a second spacer material, such as $Si_3N_4$, is deposited and anisotropically etched to form a continuous, cylindrical second spacer 38 as illustrated in FIG. 1H. This spacer is not sacrificial, as was first spacer 25 of FIG. 1D. The second spacer material must have the ability to be etched selective to the underlying protective dielectric, and must be an insulating material. In etching the second spacer material, a portion of the gate dielectric 28 is also removed from the top surface of epitaxial column 24. Removing this portion of the gate dielectric enables electrical contact to be made to the column and may be accomplished by an etch process different from the process used to form spacer 38.

In addition to enabling electrical contact to be made to the epitaxial column, removing the gate dielectric 28 from the epitaxial column 24 also enables further selective growth. FIG. 1H illustrates such growth. An epitaxial or polycrystalline material 42 is grown (seeded by the exposed portion of epitaxial column 24) between second spacer 38. Growing material 42 has at least two advantages. One advantage is that it raises the effective height of the epitaxial column 24, allowing for easier electrical contact to be made to the column. Another advantage is that as the material grows, it conforms to the shape of second spacer 38, thereby increasing the effective width of the epitaxial column 24 as well. An increased width of the column also allows for easier contact formation. In FIG. 1H, material 42 is depicted as having (n) type conductivity. This is due to the fact that the material is grown from a seed which is also (n) type. The conductivity of material 42 may be controlled by altering the conductivity of the underlying portion of the epitaxial column. The protective dielectric 36 which is present above field oxide layer 16 prevents material 42 from growing on the corresponding portion of gate electrode 34. Rather than being selectively grown, a conductive material may be deposited and etched to form material 42 in the area illustrated in FIG. 1H. In etching the conductive material, protective dielectric 36 or field oxide layer 16 would act as an etch stop. The etch chemistry would have to be chosen such that the conductive material could be etched selectively to second spacer material 38.

Figure 1I:
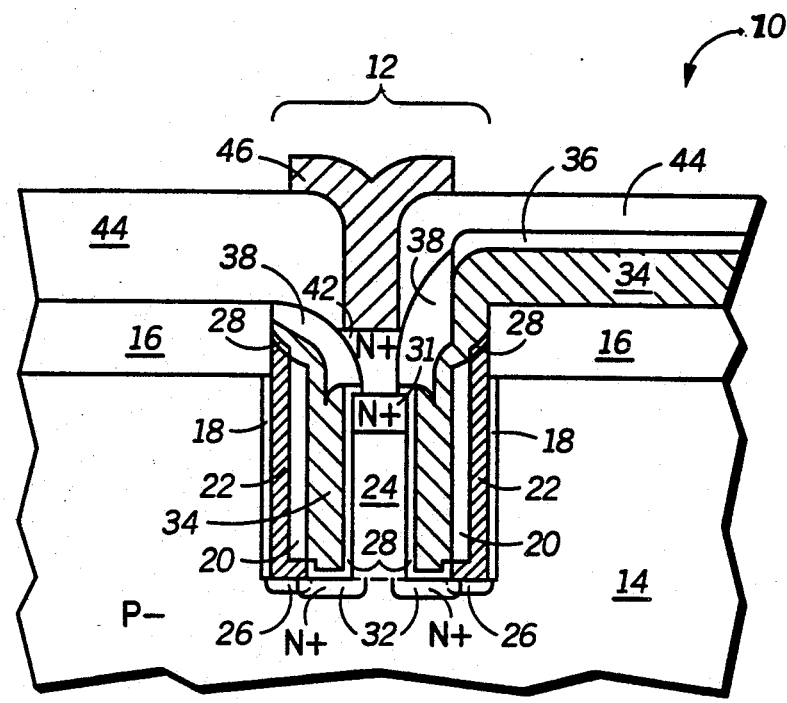

To complete the memory cell structure, a contact to epitaxial column 24 is formed. As illustrated in FIG. 1I, an insulating layer 44 is deposited over memory cell 10 and patterned to expose a portion of the epitaxial material 42. Insulating layer 44 may be of $SiO_2$, PSG (phospho-silicate glass), BPSG (boron doped phospho-silicate glass), or another insulating material which may be used in fabricating semiconductor devices. A conductive layer (not shown entirely) is then deposited and patterned to form contact 46. Suitable conductive materials for contact 46 include aluminum, aluminum alloys, polysilicon, tungsten, or the like.

In order to better understand the present invention, it will be helpful to describe FIG. 1I in more detail, but on a broader level. This description will relate a specific application of this invention, namely a DRAM cell. It should be noted that variations to this description (such as those previously described) are also in accordance with the present invention. As mentioned earlier, one form of this invention is a transistor formed within a capacitor. Such a structure is apparent in FIG. 1I. Like most capacitors, the capacitor in memory cell 10 includes two electrodes and a dielectric material separating the two electrodes. One electrode is the substrate material 14. The dielectric layer is capacitor dielectric 18. The second electrode is capacitor electrode 22. These three elements make up a cylindrical trench capacitor in memory cell 10. The base of the cylinder (which will determine the shape of the capacitor) may be circular, ellipsoidal, square, hexagonal, or of any closed shape.

The transistor in FIG. 1I is formed within the capacitor structure previously described. The drain of the transistor is drain region 32 and the source is source region 31 on the top portion of epitaxial column 24. The gate of the transistor is gate electrode 34 which surrounds epitaxial column 24, the two being separated by gate dielectric 28. The vertical sides of the epitaxial column form the channel region of the transistor. The transistor structure and capacitor structure are separated by intermediate dielectric 22. As is conventional in other one transistor/one capacitor DRAM cells, one electrode of the capacitor is tied to the drain of the transistor. Capacitor electrode 20 is tied to drain region 32 via buried contact 26. By fabricating a transistor structure inside a capacitor structure, as in the present invention, the area and volume of memory cell 10 is significantly reduced. Furthermore, the fabrication is simpler than other combined transistor/capacitor structures because it has a shallower, more realizable trench.

Figure 1J:
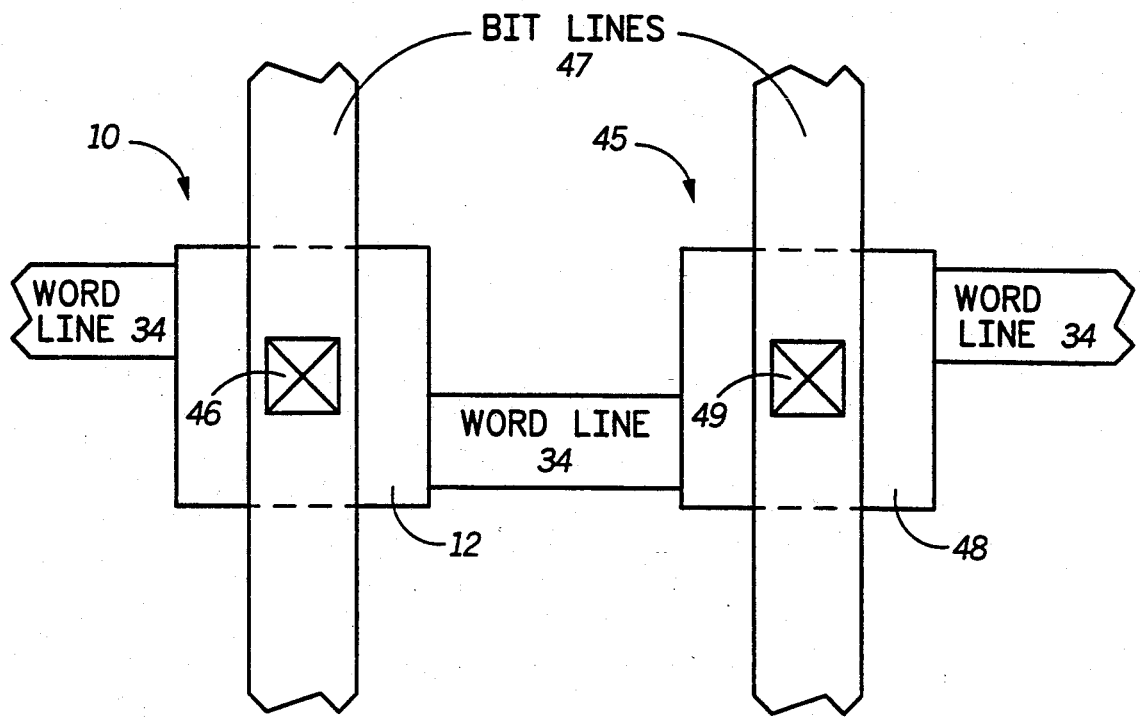

FIG. 1J is a topographical illustration of how two memory cells in accordance with the present invention might appear in a DRAM. A DRAM is actually formed from an array of a plurality of such cells, two of which are illustrated in FIG. 1J. Cell 10 in the left portion of the figure includes trench 12 and contact 46 (the same cell, trench and contact as illustrated in FIG. 1H). The trench in this case is shaped as a cylinder having a square base, but as mentioned earlier any shaped cylinder is suitable. Contact 46 is one which electrically connects a BIT line 47 to the source region of the transistor (not visible). Also included in this cell is gate electrode 34, which forms a WORD line. WORD lines and BIT lines in DRAM devices are used to find a memory cell location and read or write to that location. In FIG. 1J, the WORD line joins an adjacent cell, cell 45, which also includes a trench 48 and a contact 49 connecting BIT line 47 to the source region (not shown) of the cell.

In another embodiment of the present invention, a capacitor is formed within a transistor. FIGS. 2(A-H) are cross-sectional illustrations depicting a capacitor formed within a transistor in accordance with the invention. In forming a capacitor within a transistor, similar processing steps to those of the previous embodiment are used, but the names of some elements have been changed to better describe functionality. For example, the capacitor dielectric formed in the first embodiment is essentially the same as the gate dielectric of the present embodiment. It should be noted that the materials which may be used in each of the embodiments are also comparable.

Figure 2A:
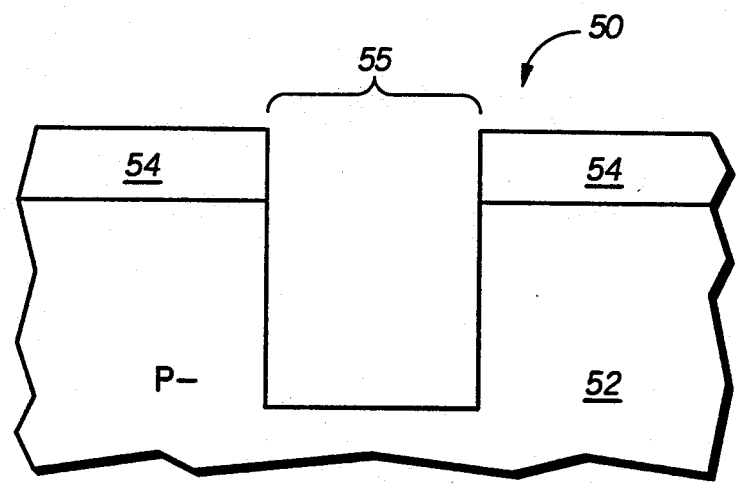
FIGS. 2(A-H) are cross-sectional views of a memory cell which illustrate a method for forming a capacitor within a transistor in accordance with the present invention.
FIG. 2I is a topographical illustration of two memory cells formed by the method depicted in FIGS. 2(A-H).
Figure 2B:
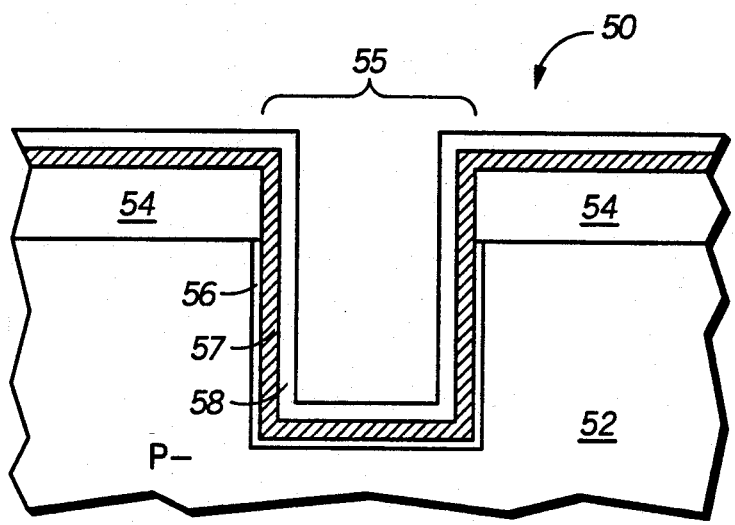

As illustrated in FIG. 2A, the fabrication of a memory cell 50 begins with forming a trench 55 as in the earlier form of the invention. A field oxide layer 54 is formed on a substrate material 52, and a trench 55 is formed by etching the field oxide layer and substrate material. The substrate material 52 is illustrated as having a (p) type conductivity, but an (n) type material may be used in the alternative. FIG. 2B illustrates that a gate dielectric 56 is formed within substrate material 52 and along the wall and floor of trench 55. This gate dielectric may be grown from the exposed wall and floor of trench 55 (as illustrated), or the dielectric may be deposited. Unlike the capacitor dielectric in the previous embodiment, the gate dielectric is not removed from substrate material 52 at the floor of the trench. A gate electrode 57 is then formed over cell 50. Suitable electrode materials include polysilicon or refractory metals which are used in fabricating semiconductor devices. An intermediate dielectric 58 is also formed over cell 50, being made of $SiO_2$, $Si_3N_4$, or other material having dielectric properties.

Figure 2C:
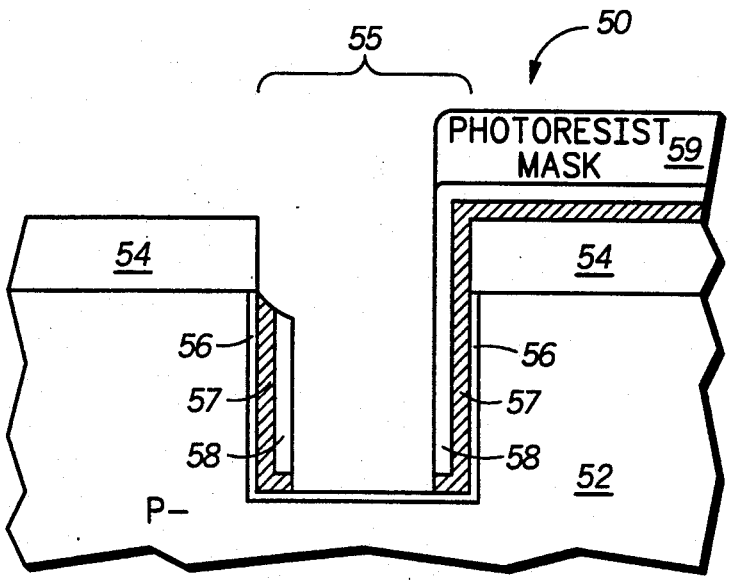
Figure 2D:
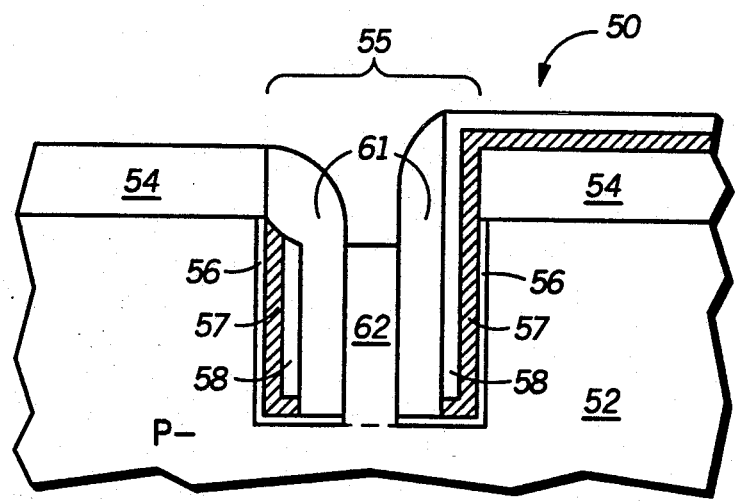

The memory cell 50 is subjected to an anisotropic etch which removes portions of the gate electrode and intermediate dielectric. However, unlike the process illustrated in the previous embodiment, a mask is used to protect an area of the cell, as illustrated in FIG. 2C. A photoresist mask 59 is formed on one side of memory cell 50, above intermediate dielectric 58 and gate electrode 57. This protection is required to maintain continuity of the two materials between trench 55 and areas outside of cell 50. During an anisotropic etch, portions of gate electrode 57 and intermediate dielectric 58 are removed such that a portion of gate dielectric 56 on the trench floor is exposed. Along the wall of trench 55 which is not protected by photoresist mask 59, the gate electrode 57 and intermediate dielectric 58 are only partially removed.

The photoresist mask is removed and a spacer material is deposited over cell 50. The spacer material is anisotropically etched to form a spacer 61 in FIG. 2D. It appears that two spacers are present, but actually one spacer exists which is continuous inside the wall of the cylindrical trench. This is also true for gate electrode 57 and intermediate dielectric 58, and subsequent materials formed in trench 55. The spacer material is etched such that a portion of gate dielectric 56 on the floor of trench 55 becomes exposed. This exposed portion is then removed either by continuing the anisotropic etch used to form spacer 61 or by a subsequent etch step. A portion of the gate dielectric on the floor of the trench must be removed in order to expose a portion of the substrate material. The exposed portion of substrate material 52 is used as a seed to grow an epitaxial column 62 between spacer 61.

Figure 2E:
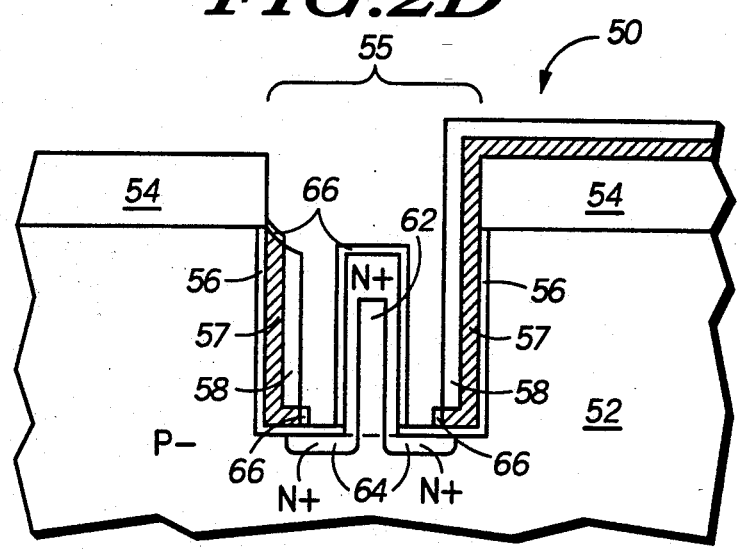

Once the epitaxial column is formed, the spacer 61 is removed by selectively etching the spacer, without substantially altering the remainder of the memory cell. At this point, epitaxial column 62 is exposed and freestanding within trench 55. A dielectric material is then grown or deposited on exposed portions of the gate electrode and the epitaxial column. This dielectric material is illustrated in FIG. 2E as capacitor dielectric 66. A drain region 64 is formed by doping memory cell 50 with a desired dopant species. In this case, drain region 64 is doped to become (n) type, although a (p) type dopant may also be used. The drain region extends from one side of gate electrode 57, along the edges of epitaxial column 62, to the other side of gate electrode 57. Doping may be accomplished through angled ion implantation or diffusion. Besides providing electrical isolation between neighboring conductive layers, capacitor dielectric 66 also prevents contamination of and damage to memory cell 50 which might occur during the doping process. However, it is also possible to dope cell 50 prior to forming capacitor dielectric 66.

Figure 2F:
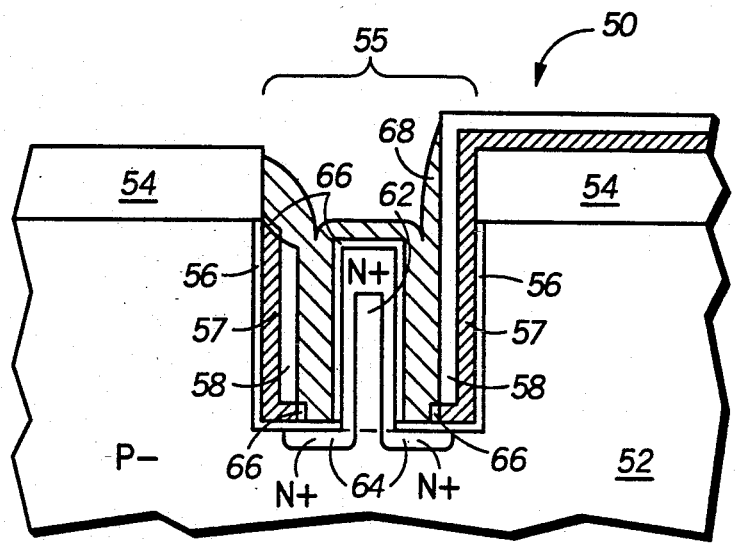

A capacitor electrode 68 is deposited onto memory cell 50, filling vacant portions within trench 55, and patterned as illustrated in FIG. 2F. Capacitor electrode 68 is made from a conductive material, such as polysilicon, tungsten, or a refractory metal. The capacitor electrode is etched such that the conductive material used remains only within the trench. One method of achieving this result is by depositing the capacitor electrode thicker than illustrated in FIG. 2F and performing an anisotropic etch. Another method is to deposit the capacitor electrode, protect the area of the capacitor electrode which is to remain with a mask, and etch the device. It is important that the capacitor electrode remain continuous within the trench itself.

Figure 2G:
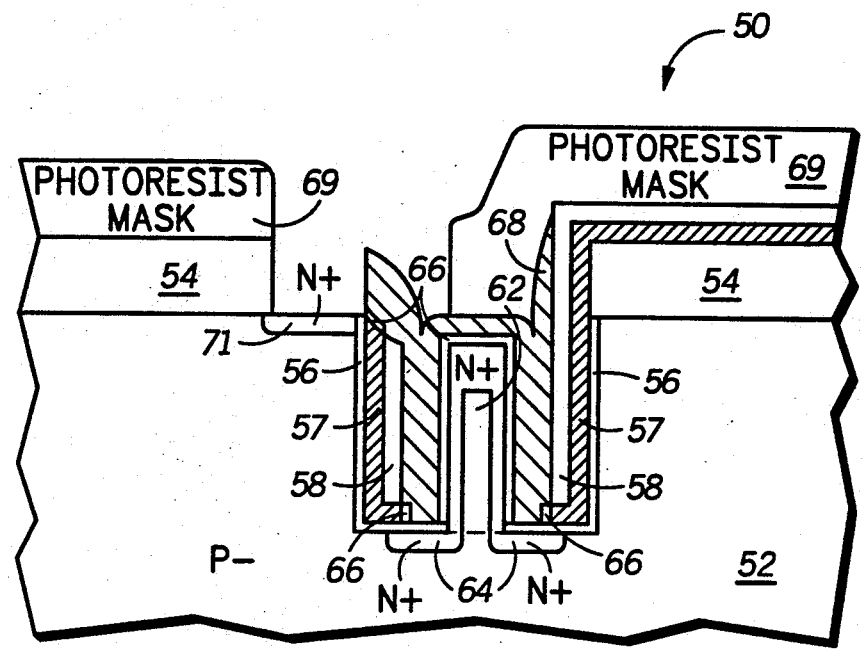

FIG. 2G illustrates a source region 71 which is created by removing a portion of field oxide layer 54 and doping memory cell 50. A selected area of the field oxide layer 54 is removed by forming a protective mask, such as a photoresist mask 69, on areas of the cell which are not to be removed and etching the cell. It may not be necessary to protect all portions of the cell which are not to be etched. For example, field oxide layer 54 may be etched selectively to capacitor electrode 68 with the appropriate chemistry, in which case the capacitor electrode would not need to be masked, as illustrated in FIG. 2G. Upon removing a portion of the field oxide layer 54, the memory cell is doped, thereby forming a source region 71. The source region 71 is illustrated as being doped with an (n) type dopant, but the dopant could be (p) type provided the substrate material and epitaxial column were of (n) type conductivity. One restriction is that both the drain region 64 and the source region 71 must be of the same conductivity. The photoresist mask 69 may be removed either prior to doping the memory cell, or after the source region 71 has been formed.

Figure 2H:
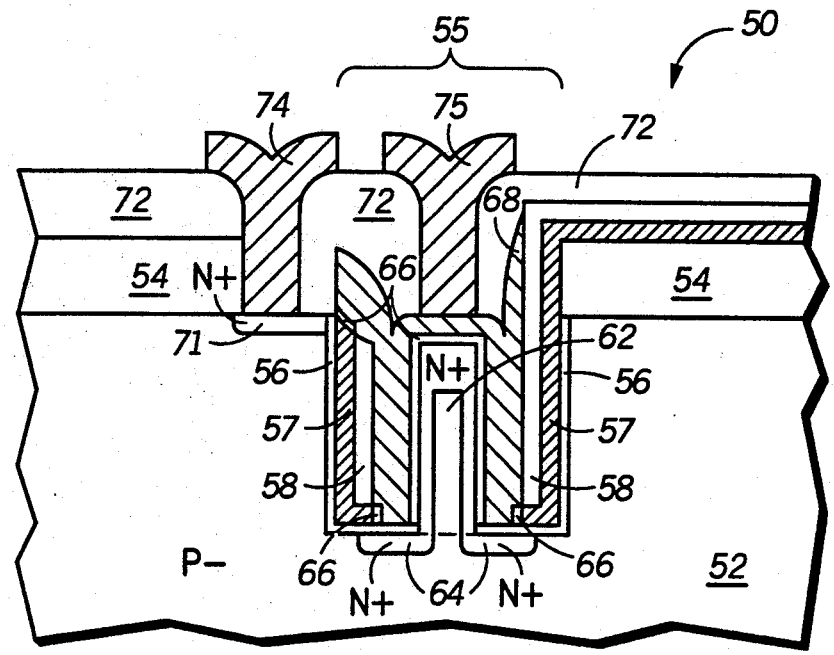

At this stage in the processing, the capacitor and the transistor are essentially complete. Looking at FIG. 2H, the transistor is comprised of drain region 64, source region 71, gate electrode 57, and gate dielectric 56. The channel region of the transistor extends along the exterior side of the wall of trench 55, between drain region 64 and source region 71. As it may be undesirable for the channel region to extend around a corner of the trench, the drain region 64 can be extended laterally, beyond the corner of the trench. If the drain is extended, the channel region is only vertical, along the exterior wall of the trench. The capacitor is comprised of capacitor electrode 68 and capacitor dielectric 66. The other electrode of the capacitor is the portions of the epitaxial column and substrate material which are adjacent to capacitor dielectric 66. To complete memory cell 50, an insulating layer 72 is deposited onto memory cell 50 and patterned to form contact openings. A conductive layer (not entirely shown) is then deposited and patterned to form contacts 74 and 75 within the contact openings in insulating layer 72, as illustrated in FIG. 2H. The contacts are positioned such that electrical contact can be made to source region 71 and to capacitor electrode 68.

Figure 2I:
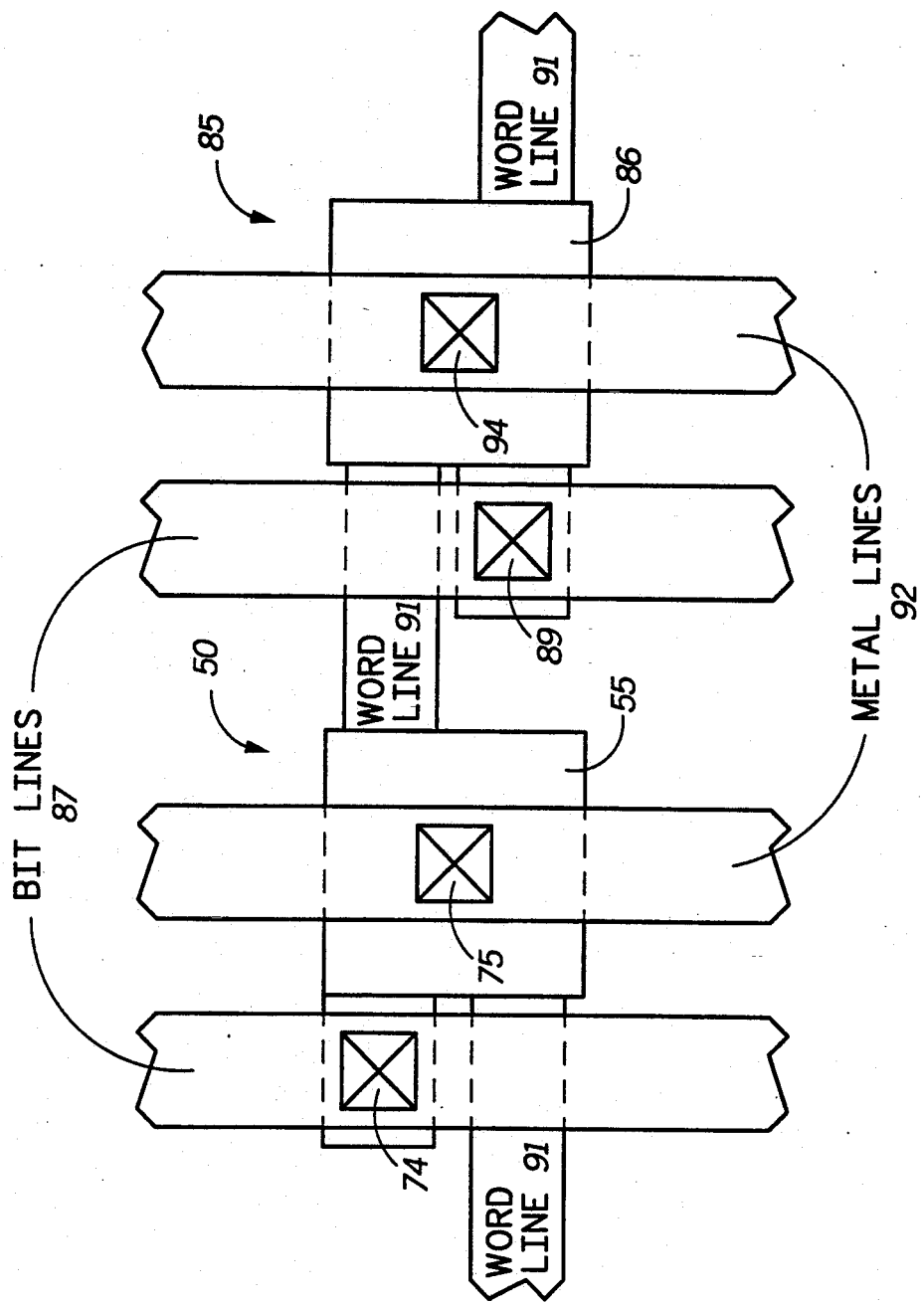

FIG. 2I is a topographical illustration of two memory cells 50 (previously discussed) and 85 in accordance with the method illustrated in FIGS. 2(A-H). An array of such cells would be used in a memory device, such as a DRAM device. Within cells 50 and 85 are trenches 55 and 86, respectively. FIG. 2I, BIT lines 87 are used to form contacts 74 and 89 which are electrically contacting source regions (not visible). A WORD line 91 joins the two cells and is used as the gate electrode within each of the cells. A metal line 92 crosses each cell and is used to form capacitor counter-electrode contacts 75 and 94. In the first embodiment described previously, capacitor contacts were not necessary because the capacitor could be accessed through the backside of the substrate material.

The area and volume needed to form a transistor and a capacitor is reduced with the present invention by fabricating a transistor within a capacitor or by forming a capacitor within a transistor. Although many ways have been implemented for forming cells containing a transistor and a capacitor, none have been proposed which integrate the structures as in this invention. Because of the significant reduction in area achieved in using this invention, and because the invention integrates the transistor and capacitor structures in such a way as to simplify the fabrication over existing integrations, this invention is useful in the development of high density circuits, such as 64 Mbit and 256 Mbit DRAMs.

Thus it is apparent that there has been provided, in accordance with the invention, a trench capacitor and transistor structure and method for forming the same that fully meets the advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, use of the invention is not limited to use in DRAM devices, but may be used in any number of semiconductor devices having the need for a transistor and capacitor. The invention is not limited to using the materials mentioned for the various elements of the invention, but may include use of any material which meets the needs of that particular element. Nor is the invention limited to the deposition, etch, and doping method described or illustrated. Furthermore, it is not intended that the dimensions illustrated or described be limitations to this invention. In addition, this invention is not limited to use in MOS (metal oxide semiconductor) semiconductor devices, but may be implemented in CMOS (complimentary MOS) and Bi-CMOS (a combination of bipolar and CMOS) devices as well. Therefore, it is intended that this invention encompass all such variations and modifications as fall within the scope of the appended claims.

I claim:

1. In a semiconductor structure, a method for forming a transistor and a capacitor within a single trench comprising the steps of:

providing a substrate material;
   forming a trench in the substrate material, the trench having a floor and a wall;
   forming a conductive pillar on the floor of the trench;
   forming a transistor having first and second current electrodes and a gate electrode, wherein the first current electrode is formed in part in the substrate material adjacent the trench floor and in part in the conductive pillar and the gate electrode is formed in the trench, conforming to the entire trench wall and substantially surrounding the conductive pillar; and
   forming a capacitor within the trench such that the capacitor is substantially surrounded by the gate electrode of the transistor, wherein the capacitor has a first capacitor electrode formed by the conductive pillar and has a second capacitor electrode which substantially surrounds the conductive pillar.

2. The method of claim 1 wherein the step of forming a capacitor comprises forming the capacitor such that the capacitor fills the remaining portion of the trench.

3. The method of claim 2 wherein the transistor and capacitor are formed in a DRAM.

4. The method of claim 2 wherein the step of
   forming a conductive pillar comprises epitaxially growing a conductive pillar.

5. The method of claim 2 comprising the steps of:
   forming a field oxide layer on the substrate material;
   etching selected areas of the field oxide and the substrate material underlying the selected areas of field oxide to form the trench;
   forming a gate dielectric on the floor and the wall of the trench;
   depositing the gate electrode material adjacent the gate dielectric;
   forming an intermediate dielectric adjacent the gate electrode material;

anisotropically etching the gate electrode material and the intermediate dielectric to expose a portion of the gate dielectric on the trench floor and to form the gate electrode of the transistor;

depositing a first spacer material in the trench overlying remaining portions of the gate electrode material and the intermediate dielectric;

anisotropically etching the resulting structure to substantially remove the first spacer material and the gate dielectric from a portion of the floor of the trench, thereby exposing a portion of the trench floor, and to form a spacer overlying the gate electrode;

selectively growing an epitaxial column which is seeded by the exposed portion of the trench floor to form the material comprising the conductive pillar;

selectively etching the resulting structure to substantially remove the spacer without substantially altering remaining portions of the intermediate dielectric material, the gate electrode material, and the epitaxial column;

forming a capacitor dielectric overlying at least the epitaxial column;

doping the epitaxial column and a portion of the trench floor to form the first current electrode;

depositing a capacitor counter electrode within the trench and overlying the capacitor dielectric;

removing a portion of the field oxide layer which is adjacent the trench wall to define a second current electrode region; and doping the second current electrode region to form the second current electrode.

6. The method of claim 5 wherein the step of doping the epitaxial column to form the first current electrode is performed prior to the step of forming the capacitor dielectric.

7. The method of claim 5 further comprising the steps of:

depositing an insulating layer over the structure and patterning the insulating layer to expose a portion of the second current electrode and a portion of the capacitor counter electrode; and depositing a conductive layer over the structure and patterning the conductive layer to form a contact to each of the exposed portions of the second current electrode and the capacitor electrode.

8. The method of claim 5 wherein the step of etching selected areas of the field oxide and the substrate material comprises forming a trench which has a depth substantially in the range of 0.5–2.0 μm.

9. The method of claim 5 wherein the step of etching selected areas of the field oxide and the substrate material comprises forming a trench which has a width substantially in the range of 0.4–2.0 μm.

10. A method for making a semiconductor device comprising the steps of:

providing a semiconductor substrate;

forming a trench in the semiconductor substrate, the trench having a floor and a wall;

forming a transistor within the trench, the transistor having an annular gate electrode which conforms to the trench wall and having first and second current electrodes;

forming an epitaxial conductive pillar in a central portion of the trench within the annular gate electrode, the conductive pillar extending upward from the trench floor and being doped to form one of the current electrodes of the transistor;

forming a capacitor within the trench and within the annular gate electrode such that the conductive pillar forms a first capacitor electrode.

11. The method of claim 10 wherein the step of forming a transistor comprises forming a transistor having a drain electrode formed underlying the trench floor, a source electrode formed in the semiconductor substrate adjacent the trench wall, and a channel region defined by the trench wall.

12. The method of claim 11 further comprising the step of doping the conductive pillar and a portion of the trench floor to form the drain electrode of the transistor.

13. The method of claim 10 wherein the step of forming a capacitor comprises forming a capacitor having a second electrode which substantially surrounds the conductive pillar.

* * * * *